US008091280B2

(12) United States Patent
Hanzel et al.

(10) Patent No.: US 8,091,280 B2
(45) Date of Patent: Jan. 10, 2012

(54) ARMS FULL VEHICLE CLOSURE ACTIVATION APPARATUS AND METHOD

(75) Inventors: Andrew J. Hanzel, Washington, MI (US); Louise E. Stauffer, Bloomfield Hills, MI (US); Maurice J. Gisler, Rochester Hills, MI (US); Xiujie Gao, Troy, MI (US); Craig A. Kollar, Sterling Heights, MI (US); Jack L. Bailey, Center Line, MI (US); Gregory Lynn Dantzler, Troy, MI (US); Michael Reber White, Rochester, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 784 days.

(21) Appl. No.: 11/756,781

(22) Filed: Jun. 1, 2007

(65) Prior Publication Data
US 2008/0296926 A1  Dec. 4, 2008

(51) Int. Cl.
*E05F 15/20* (2006.01)

(52) U.S. Cl. .................. 49/25; 49/506; 296/146.4

(58) Field of Classification Search ............ 49/25, 506; 296/146.4; 318/16; 340/825.31, 825.32, 340/825.69, 825.72
See application file for complete search history.

(56) References Cited

U.S. PATENT DOCUMENTS

| | | | | |
|---|---|---|---|---|
| 2,023,845 A * | 12/1935 | Larose | ............................. | 40/556 |
| 2,276,104 A * | 3/1942 | Shaunessey | ..................... | 353/13 |
| 4,183,177 A * | 1/1980 | Kurdziel | ............................ | 49/25 |
| 4,644,693 A * | 2/1987 | Wang | .............................. | 49/280 |
| 4,895,009 A * | 1/1990 | Kleefeldt et al. | ................ | 70/264 |
| 5,369,911 A * | 12/1994 | Fortunato | ............................ | 49/25 |
| 5,552,789 A * | 9/1996 | Schuermann | ................. | 340/5.21 |
| 5,588,258 A | 12/1996 | Wright et al. | | |
| 5,782,036 A * | 7/1998 | Bertieri et al. | ..................... | 49/25 |
| 5,929,769 A * | 7/1999 | Garnault | ....................... | 340/5.61 |
| 6,023,224 A * | 2/2000 | Meyvis | ....................... | 340/545.1 |
| 6,073,101 A * | 6/2000 | Maes | ............................ | 704/275 |
| 6,075,460 A * | 6/2000 | Minissale et al. | ......... | 340/825.69 |
| 6,091,162 A * | 7/2000 | Williams et al. | ............ | 307/10.1 |
| 6,164,015 A * | 12/2000 | Kawanobe et al. | ............. | 49/360 |
| 6,220,737 B1 * | 4/2001 | Baragona | ....................... | 362/540 |
| 6,293,050 B1 * | 9/2001 | Johnk | ............................. | 49/276 |
| 6,323,565 B1 * | 11/2001 | Williams et al. | ............ | 307/10.1 |
| 6,476,517 B1 * | 11/2002 | Okada | .......................... | 307/10.2 |

(Continued)

FOREIGN PATENT DOCUMENTS
DE 4409167 C1 6/1995
(Continued)

*Primary Examiner* — Jerry Redman
(74) *Attorney, Agent, or Firm* — Quinn Law Group, PLLC

(57) ABSTRACT

A vehicle is provided having a sensor for detecting a vehicle occupant's presence, and another sensor for detecting an owner's response with respect to automatically opening a vehicle closure panel. An actuator opens the closure panel when the occupant's presence and response are detected. A signal from an emitter outside the vehicle signals occupant presence. A photoelectric and/or optical device, audio receiver, and/or touch-sensitive sensor detects the response. The optical device projects a light beam, and breaking the beam with a gesture signals the response. An automatic closure panel opening apparatus has an RF receiver adapted to receive an RF signal to detect occupant presence, a sensor for detecting the occupant response, and an actuator for opening the closure panel when both the presence and occupant response are detected. A method for automatically opening the closure panel includes detecting an occupant presence and response, and automatically opening the closure panel when a predetermined response is detected.

19 Claims, 3 Drawing Sheets

U.S. PATENT DOCUMENTS

| | | | |
|---|---|---|---|
| 6,496,107 B1 * | 12/2002 | Himmelstein | 340/426.1 |
| 6,550,839 B2 | 4/2003 | Rogers, Jr. et al. | |
| 6,580,356 B1 * | 6/2003 | Alt et al. | 340/5.8 |
| 6,628,196 B1 * | 9/2003 | Flick | 340/426.13 |
| 6,685,347 B2 * | 2/2004 | Grutze | 362/487 |
| 6,765,471 B1 * | 7/2004 | Baudard et al. | 340/5.61 |
| 6,825,752 B2 * | 11/2004 | Nahata et al. | 340/5.64 |
| 6,856,239 B1 * | 2/2005 | Hicks | 340/5.7 |
| 7,034,485 B2 * | 4/2006 | Kuan et al. | 318/466 |
| 7,057,307 B2 * | 6/2006 | Yokomori | 307/10.1 |
| 7,081,811 B2 * | 7/2006 | Johnston et al. | 340/449 |
| 7,102,507 B1 * | 9/2006 | Lauren | 340/539.11 |
| 7,180,454 B2 * | 2/2007 | Asakura et al. | 343/713 |
| 7,292,137 B2 * | 11/2007 | Gilbert et al. | 340/426.3 |
| 7,327,107 B2 * | 2/2008 | Mullet et al. | 318/280 |
| 7,474,200 B2 * | 1/2009 | Ogino et al. | 340/426.16 |
| 7,600,550 B2 * | 10/2009 | Mays | 160/188 |
| 7,629,873 B2 * | 12/2009 | Ghabra et al. | 340/5.25 |
| 7,635,960 B2 * | 12/2009 | Mullet et al. | 318/280 |
| 2001/0054952 A1 * | 12/2001 | Desai et al. | 340/5.72 |
| 2002/0063623 A1 * | 5/2002 | Juzswik | 340/442 |
| 2005/0156743 A1 * | 7/2005 | Gallivan et al. | 340/573.4 |
| 2005/0242923 A1 * | 11/2005 | Pearson et al. | 340/5.62 |
| 2005/0258934 A1 * | 11/2005 | Buck et al. | 340/5.23 |
| 2006/0267374 A1 * | 11/2006 | Jackson et al. | 296/146.4 |
| 2007/0285510 A1 * | 12/2007 | Lipton et al. | 348/135 |
| 2008/0296927 A1 * | 12/2008 | Gisler et al. | 296/146.4 |

FOREIGN PATENT DOCUMENTS

| | | |
|---|---|---|
| DE | 4440855 A1 | 5/1996 |
| DE | 19818263 A1 | 10/1999 |
| DE | 19937086 A1 | 2/2000 |
| DE | 19848001 A1 | 4/2000 |
| DE | 102006044112 A1 | 3/2008 |

* cited by examiner

ARMS FULL VEHICLE CLOSURE ACTIVATION APPARATUS AND METHOD

TECHNICAL FIELD

The present invention relates to an apparatus and method for detecting the presence of a current or potential vehicle occupant, and for detecting a corresponding hands-free response from the occupant which signals for an automatic or power-assisted actuation of one or more vehicle closure panels.

BACKGROUND OF THE INVENTION

Conventional automotive vehicles are typically entered by lifting or pulling on an exterior door handle to thereby actuate a lever contained within the door, thereby unlatching the door so that it may freely pivot about a hinge mechanism. Modern vehicle doors may include a remote access device such as a push-button key fob that an occupant may activate a short distance away from the vehicle in order to automatically unlock one or more vehicle doors. Certain vehicles such as minivans may include one or more power sliding side doors, which may be similarly activated using a button on the inside of the vehicle or on a push-button fob. With such remote access devices, vehicle doors automatically lock or unlock, and sometimes open and close, at the touch of a button, thus simplifying entry to and egress from the vehicle. Additionally, passive entry mechanisms are also available with certain vehicles to allow automatic unlocking of an exterior door upon detection of the proximate presence of the passive entry mechanism.

While such remote access and passive entry devices are useful for some purposes, they may prove less than optimally efficient under certain circumstances. For example, when using a standard manual door handle, at least one hand must remain free or unencumbered in order to exert sufficient force on the door handle. Likewise, the use of a button on a key fob requires depressing one or more buttons on the key fob, usually using a finger or thumb. However, when an occupant approaches a vehicle with full arms, such as when holding a child, or bags of groceries, packages, or other similar items, or with limited personal mobility, the manual actuation of a door handle and/or the depression of a manual button on a key fob may prove to be a challenging maneuver.

SUMMARY OF THE INVENTION

Accordingly, a vehicle is provided having a closure panel and an actuator configured for automatically opening and/or closing the closure panel. At least one presence sensor is configured for detecting the presence of a potential occupant of the vehicle, and at least one occupant response sensor is configured for detecting an occupant response. The vehicle includes a controller having a stored expected occupant response, with the controller being operable for comparing the detected occupant's response to the stored expected occupant response, and for activating the actuator to open or close the closure panel when the presence is detected and the detected occupant response equals the stored expected occupant response.

In one aspect of the invention, the first sensor is a radio frequency (RF) receiver adapted to receive an RF signal emitted by an RF emitter positioned external to the vehicle.

In another aspect of the invention, the second sensor is an optical presence sensor, an audio receiver, an ultrasonic sensor, a laser sensor, and/or a touch-sensitive sensor.

In another aspect of the invention, the occupant response sensor has an emitter for projecting a light beam onto a surface, with the detected occupant response being interference with the path of the light beam using a gesture.

In another aspect of the invention, the emitter generates a customizable logo and projects the logo onto the surface.

In another aspect of the invention, the occupant response sensor is an audio receiver and the vehicle includes voice recognition software, with the expected occupant response being a predetermined word or phrase spoken by the occupant.

In another aspect of the invention, an automatic closure panel opening apparatus is provided for use a vehicle having a closure panel and an actuator configured for automatically opening the closure panel. The apparatus includes an RF receiver adapted to receive an RF signal from an RF emitter positioned external to the vehicle to thereby detect the presence of an occupant of the vehicle, at least one sensor for detecting an occupant response, and a controller operable for comparing the detected occupant response to the stored expected occupant response, and for activating the actuator when the presence is detected and when the detected occupant response equals the stored expected occupant response.

In another aspect of the invention, a method for automatically opening a vehicle closure panel includes detecting the presence of an occupant of the vehicle, alerting the occupant that the presence has been detected, detecting an occupant response, comparing the detected occupant response to a stored expected occupant response, and automatically opening or closing the vehicle closure panel when the detected occupant response equals the stored expected occupant response.

The above features and advantages and other features and advantages of the present invention are readily apparent from the following detailed description of the best modes for carrying out the invention when taken in connection with the accompanying drawings.

DESCRIPTION OF THE PREFERRED EMBODIMENTS

Figure 1:
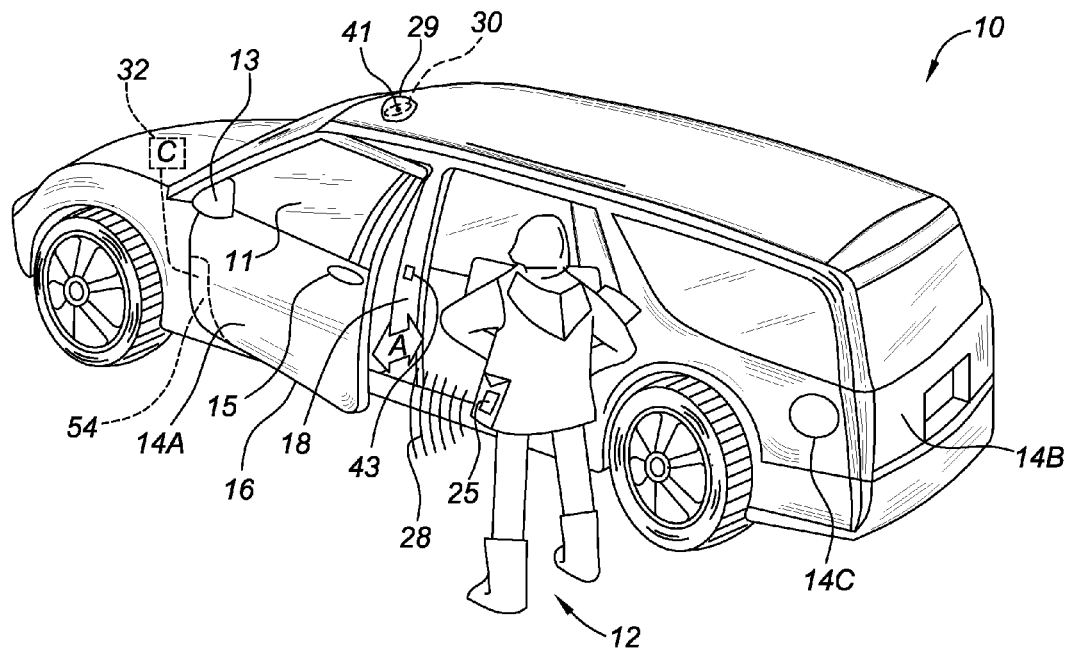
FIG. 1 is a schematic perspective illustration of a vehicle having an automatically actuatable closure panel according to the invention.

Referring to the drawings wherein like reference numbers correspond to like or similar components throughout the several figures, there is shown in FIG. 1 a vehicle 10 having a power-assisted or automatically actuatable side door or closure panel 14A. Closure panel 14A as shown in FIG. 1 is a preferred side-swinging side entry vehicle door having a window 11, although any moveable vehicle closure panel may be used in accordance with the invention, for example a rear lift glass and/or lift gate 14B, a gas cap door 14C, a power sliding door (not shown), trunk (not shown), hood (not shown), or an internal closure such as a glove box or console (not shown). For simplicity, preferred closure panel 14A will be referred to hereinafter.

Closure panel 14A is operatively and/or electrically connected to an actuator mechanism or actuator 54 that is configured or adapted to automatically move closure panel 14A, as represented by bidirectional arrow A, to thereby open and/or close closure panel 14A as described in detail hereinbelow. Vehicle 10 as shown in FIG. 1 is a sport utility vehicle (SUV) having a hinged or swing-type closure panel 14A, however vehicle 10 may be any type of passenger or cargo vehicle equipped with one or more closure panels 14A. Additionally, vehicle 10 is preferably provided with an obstacle detection means, such as a light-touch or a non-contact obstacle detection means, sufficient for detecting the presence of an obstacle (not shown) within the path or range of motion of closure panel 14A, with controller 32 being operable for modifying the movement of closure panel 14A in response to such obstacle detection in order to avoid or minimize contact with an obstacle.

Within the scope of the invention, actuator 54 may be any hydraulic, electromechanical, rack and pinion, sector gear, electromagnetic, electromechanical-pneumatic, electromechanical-hydraulic, and/or other automatic or power-assisted actuating device or system capable of alternately exerting a sufficient opening and/or a sufficient closing force on closure panel 14A as needed. Preferably, actuator 54 is operable in its most basic embodiment for "popping open" closure panel 14A, i.e. opening closure panel 14A a sufficient distance to enable an occupant 12 or other passenger or user of the vehicle 10 to insert an elbow or other suitable body part or object partially into vehicle 10 to thereby leverage closure panel 14A and open it completely. This capability is particularly desirable in the event occupant 12 has full arms or hands as shown in FIG. 1, or other situations in which the use of hands requires an impossible, difficult, or undesirable maneuver. For example, a spring and/or powered release pin, latch, and/or other mechanism suitable for achieving the "pop open" or ajar position may be used alone or in conjunction with actuator 54 and closure panel 14A. Additionally, actuator 54 and/or closure panel 14A are also preferably operable for holding open or sustaining an ajar position of closure panel 14A, for example via a detent in a conventional, integral, or continuous check link.

In addition to the basic "pop-open" functionality described hereinabove, actuator 54 is preferably selectively operable for automatically powering closure panel 14A to either or both of a fully opened and a fully closed position. Depending on the particular construction of closure panel 14A, actuator 54 may also include a multi-power option, i.e. a power-assisted or automatic opening and/or closing of closure panel 14A through multiple directions, planes, or geometries. This may occur, for example, by the pivoting or swinging of closure panel 14A through a portion of the available range of motion of closure panel 14A, and then sliding or rolling through another portion of the available range of motion of closure panel 14A via linkages, tracks, guide rails, or other comparable mechanisms as needed.

Likewise, an actuation device or mechanism (not shown) such as a button, lever, knob, or other similar device or mechanism is preferably positioned at a convenient location within vehicle 10 (see FIG. 1), and may be manually depressed to open or close closure panel 14A as previously described hereinabove. Actuator 54 may also be configured for closing closure panel 14A once occupant 12 has traveled a sufficient predetermined distance away from vehicle 10, such as by sensing the proximity of occupant 12. Integral situational programmability and occupant-input options may be included to ensure an occupant-preferred response in a particular predetermined situation, such as while parking in a garage or other such confined space. Finally, instantaneous occupant override or bypass capability is preferably available to occupant 12 at all times, for example by an attended control operation or functionality similar to the attendant operation of a power window switch, or via a bypass mode temporarily enabling only a standard or manual operation of closure panel 14A if so desired.

Still referring to FIG. 1, vehicle 10 includes a programmable control module or controller 32 that is programmed or otherwise configured to detect both the presence of a potential occupant 12, such as a potential driver or passenger of vehicle 10, and a predetermined occupant response upon such detection. To that end, when vehicle 10 is approached by occupant 12 having limited use or mobility of his or her hands such as depicted in FIG. 1, an emitter 25 transmits or emits a signal 28 that is recognizable by controller 32 as uniquely identifying occupant 12. Emitter 25 is preferably a radio-frequency (RF) emitter sized to be easily carried on or within a key chain, fob, tag, or similarly transportable device. Vehicle 10 is therefore equipped with an RF receiver 30, along with an audio receiver 41 described later hereinbelow, positioned at an appropriate location on or within the body of vehicle 10, for example housed or contained within an integrated antenna 29, which is shown for illustrative purposes in FIG. 1 as a convex structure, but which in operation would preferably be integrated into the structure of vehicle 10, such as an external body panel, so as not to be visible or readily discernable. Alternately, RF receiver 30 may be positioned on a B-pillar 18, a rear view mirror housing 13, a handle 15 of closure panel 14A, along a bottom 16 of closure panel 14A, and/or other suitable location on or within vehicle 10. Vehicle 10 may also include a touch-sensitive sensor 43, as will be described later hereinbelow with reference to FIG. 3.

Signal 28 is preferably confined to a limited bandwidth, and/or sufficiently modulated or otherwise securely encoded to ensure the uniqueness of signal 28 with respect to occupant 12. Signal 28 may be user-selected or randomly generated using a rolling code in synchronization with RF receiver 30. Preferably, the bandwidth of the signal generated by emitter 25, and the tuned frequency of RF receiver 30, are configured to provide a sufficiently high signal-to-noise ratio at a distance of approximately 5 to 10 feet from vehicle 10, or at a similar distance to that currently used to actuate an automatic lock using a standard key fob, so that proper authentication of occupant 12 may occur while occupant 12 is still positioned within a comfortable range or distance from vehicle 10.

Figure 2:
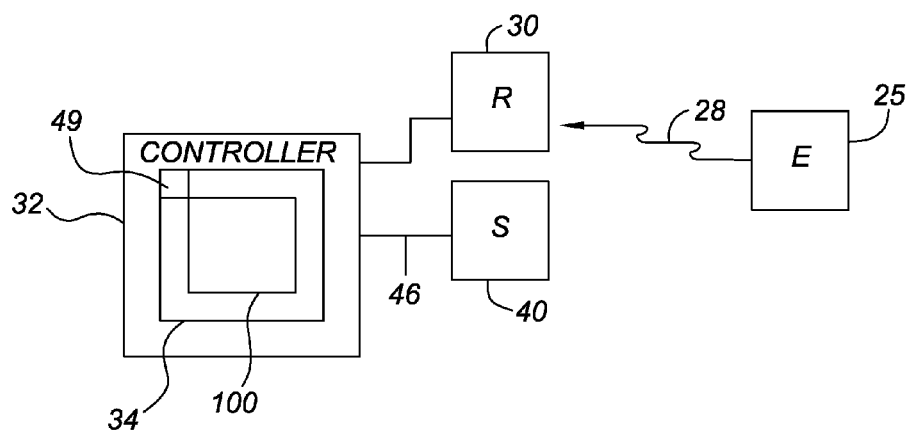
FIG. 2 is a schematic diagram of a controller and sensor useable with the invention.

Turning to FIG. 2, controller 32 is shown having sufficient memory 34, with memory 34 containing optional voice recognition software 49 and a method or algorithm 100. Voice recognition software 49 is described later hereinbelow with reference to FIG. 3, and algorithm 100 is described later hereinbelow with reference to FIG. 5, with algorithm 100 including all of the necessary control logic required to enable the invention. As explained hereinabove, emitter 25, also labeled "E" in FIG. 2, is preferably an RF emitter, and signal 28 is preferably a unique RF signal having a relatively narrow or restricted bandwidth. RF receiver 30, also labeled "R" in FIG. 2, is preferably tunable to the specific frequency or bandwidth of signal 28. One or more occupant response sensors 40, also labeled "S" in FIG. 2, are in electrical communication with controller 32, such as via hard wiring 46 and/or via datalink, and are initiated or activated upon receipt of signal 28 to thereby detect a predetermined occupant response.

Figure 3:
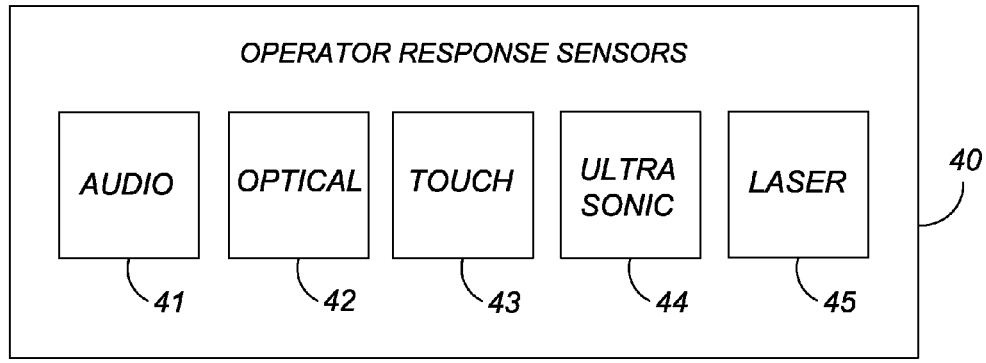
FIG. 3 is a schematic illustration of operator response sensors usable with the invention.

Turning to FIG. 3, occupant response sensors 40 may include one or more of an audio receiver 41, a photoelectric or optical sensor 42, a touch-sensitive sensor 43, an ultrasonic sensor 44, and/or a laser sensor 45, each of which is operable alone or in conjunction with the other sensors 40 to detect or otherwise determine a response of occupant 12 (see FIG. 1). The term "occupant response" as used herein refers to a response of occupant 12, such as a spoken or physical command, gesture, or series of gestures or commands, used to signal approval of execution of a particular predetermined vehicle response, such as the locking/unlocking and/or opening/closing of closure panel 14A.

Audio receiver 41 may be any sensory device or system capable of capturing a unique audible sound, word, and/or phrase spoken by occupant 12, and of relaying the captured or detected audio data to controller 32, where it is compared to a previously recorded or stored expected sound, word, and/or phrase, such as by using voice recognition software 49 stored in memory 34 (also see FIG. 2). Audio receiver 41 is preferably integrated into RF receiver 30 with an integrated antenna 29, as shown in FIG. 1, to maximize component efficiency, but which also may be a separate device as deemed appropriate by a user of the invention. The stored expected occupant response is preferably variably user-programmable or selectable, and stored within memory 34 of controller 32 to allow customization. Optical sensor 42 may be any sensory device or system capable of photo electrically and/or optically detecting the relative position and/or motion of occupant 12 relative to the position of optical sensor 42.

Figure 4A:
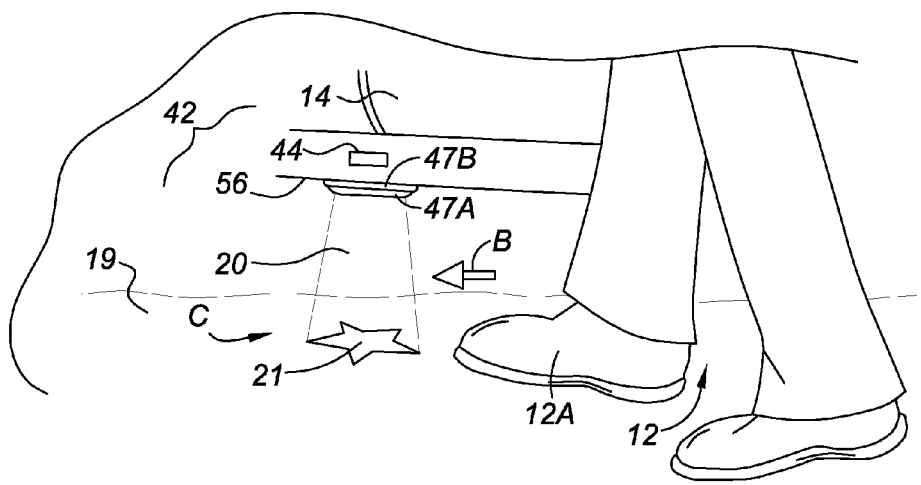
FIG. 4a is a schematic perspective illustration of an emitter according to one embodiment of the invention.

Turning briefly to FIG. 4a, optical sensor 42 may utilize a combination of an emitter 47A and a receiver 47B (see FIG. 4a). Such an emitter 47A may take the form of a laser projection diode or module capable of generating and projecting a concentrated light beam 20 (see FIGS. 4a and 4b) onto a stationary surface, such as surface 19 of the ground on which vehicle 10 rests or an internal surface (not shown) within vehicle 10, with receiver 47B being capable of detecting the presence, absence, and/or directional motion of an object or body part by detecting the breaking, interference with, or interruption of light beam 20, as will be discussed in detail hereinbelow.

As described above regarding audio receiver 41, a stored expected occupant response is preferably preprogrammed, selected, or otherwise stored in memory 34 of controller 32, with controller 32 being operable for comparing the occupant response detected by optical sensor 42 to the stored expected occupant response or responses to determine their equivalence or sameness. Alternately, as shown in the FIG. 4b, emitter 47A may be used in conjunction with one or more ultrasonic sensors 44 positioned at or in proximity to vehicle underside 56, in lieu of or in combination with receiver 47B, as described hereinbelow.

Turning back to FIG. 3, touch-sensitive sensor 43 (also see FIG. 1) may be any touch or proximity sensitive button, pad, surface, or other such pressure, proximity, and/or heat-sensitive surface positioned on or within vehicle 10, and which occupant 12 may touch or approach with any object or body part to signal his or her intended response, such as by touching or pressing an elbow to an exposed pad or surface (not shown) in the event of having full hands. Additionally, touch-sensitive sensor 43 may incorporate vibration sensing capabilities, such as the ability to detect the presence or change in a natural or an induced vibration on an operatively connected flat surface, such as window 11 (see FIG. 1), a relatively flat surface of closure panel 14A, or another similar and appropriate surface of vehicle 10.

Alternately, touch-sensitive sensor 43 may include electromagnetic field (EMF) sensing capabilities, i.e. the ability to detect an interruption or change in a generated EMF generated around touch-sensitive sensor 43, and/or a capacitance dimensional sensor of the type known in the art that is operable for detecting a change in capacitance between two proximate conductors, i.e. a body part of occupant 12, or an object held by occupant 12, and touch-sensitive sensor 43, upon the proximate approach of the object or body part. As described hereinabove regarding audio receiver 41 and optical sensor 42, a stored expected occupant response is preferably preprogrammed, selected, or otherwise stored in memory 34 of controller 32, with controller 32 being operable for comparing the occupant response detected by touch-sensitive device 43 to the stored expected occupant response or responses to determine their equivalence or sameness.

Finally, laser sensor 45 is any laser sensor capable of generating a concentrated beam of blue, green, red, and/or infrared light, such as available using conventional laser diodes. Emitter 47A (see FIGS. 4a and 4b) of optical sensor 42 and laser sensor 45 may utilize shared laser technology or components to minimize the number of components used. Laser sensor 45 in particular is preferably operable at least for detecting a discrete, non-patterned gesture, such as interruption or breakage of a generated beam such as light beam 20 (see FIGS. 4a and 4b) from any direction. Laser sensor 45 preferably is a Vertical Cavity Surface-Emitting Laser (VCSEL) of the type known in the art in order to maximize reliability while minimizing costs and power consumption.

Turning to FIG. 4a, an illustration of a preferred optical sensor 42 is shown having an emitter and detector 47A and 47B, respectively. Emitter 47A is configured to generate a light beam 20, such as a red, green, blue, or infrared laser or other suitably concentrated beam of light as described hereinabove, separately or in conjunction with laser sensor 45, and to project light beam 20 as a specific "hot spot" or detection zone marker onto surface 19. Emitter 47A and detector 47B may each be attached to a suitable location, such as underside 56 of vehicle 10 (see FIG. 1), closure panel 14A, or alternately attached or positioned on or near other vehicle components, such as to rear-view mirror 13, handle 15 (see FIG. 1), or at any other suitable position on the exterior of vehicle 10.

According to one embodiment, emitter 47A may be configured to project a customizable logo 21 onto surface 19, with customization of logo 21 preferably being easily user-definable via programming of controller 32 (see FIGS. 1 and 2). For example, logo 21 may include the name or initials of occupant 12, a company logo, crest, personal photograph, and/or any other image or writing desired by a user of the invention to provide a personal, customizable experience. In the event a customized logo 21 is not desired, occupant 12 preferably has the option of turning off the customized logo, in which case light beam 20 would simply form a spot of light on surface 19. Once occupant 12 has learned the location of logo 21, occupant 12 preferably has the option of shifting emitter 47A to an invisible spectrum, such as infrared, or turning off emitter 47A entirely to thereby enter a "stealth" mode so that light beam 20 and logo 21 would not be detectable to a casual observer.

Once light beam 20 is projected onto surface 19, occupant 12 signals his or her intent with regard to automatically unlocking and/or opening of closure panel 14A, and/or another closure panel or closure panel equipped according to the invention, by making a gesture, usually with a foot 12A, as represented by arrow B. A "gesture" may be the interrupting, interference with, or breaking of light beam (see arrow C of the bottom illustration of FIG. 4) by moving a foot 12A in a specific direction or pattern of directions through the path of light beam 20. Alternately, a "gesture" may be selectively limited or fixed to equal the interrupting of light beam 20 from any direction, i.e. by stepping on the surface 19 within the path of the light beam 20. A specific expected gesture may programmed or stored in memory 34 of controller 32, and may be as simple or as complex as desired by occupant 12 in order to provide a unique coded command for ensuring security of vehicle 10 (see FIG. 1), thus minimizing the chances of unauthorized or unintended entry of vehicle 10.

Figure 4B:
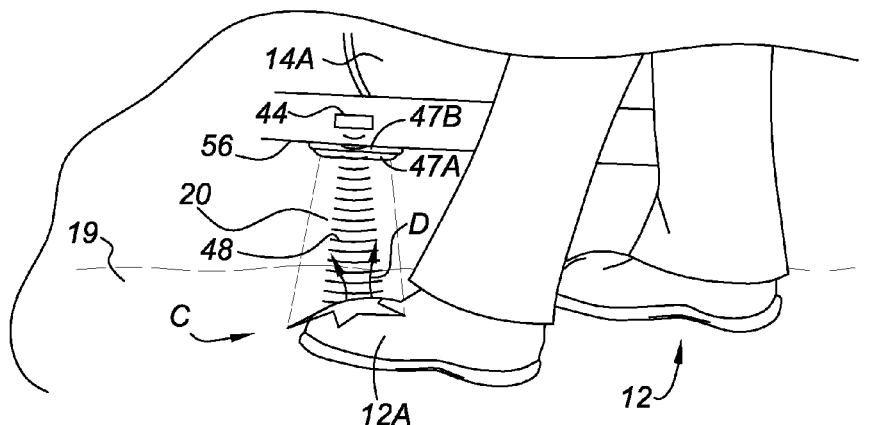
FIG. 4b is a schematic perspective illustration of the emitter of FIG. 4a also including an ultrasonic operator response sensor.

Alternately, emitter 47A may be used in conjunction with one or more ultrasonic sensors 44 (also see FIG. 3), with ultrasonic sensors 44 providing the sensing capability and emitter 47A, marking only the precise location, "hot spot", or path of ultrasonic detection waves 48, which are shown in FIG. 4b. Occupant 12 may then gesture in the path of light beam 20 marked by customizable logo 21 to signal an occupant response. Accordingly, ultrasonic sensors 44 are preferably operable for detecting a gesture of occupant 12 by sensing and measuring an interruption or disturbance in ultrasonic detection waves 48, preferably via their measurable reflection (represented in FIG. 4 by arrows D) off of an object in the path of ultrasonic detection waves 48, such as a foot 12A. Preferably, a sufficient number of ultrasonic sensors 44 are used to properly determine or measure accurate time and directional information of the gesture of occupant 12, and to thereby accurately determine the response of occupant 12 for comparison to the stored expected response.

With a sufficient number of optical sensors 42 and/or ultrasonic sensors 44, logo 21 described hereinabove may also include or take the form of a graphic representation of all available responses of closure panel 14, and/or multiple closure panels 14 or other closures usable with the invention. For example, symbols or text indicative of various closure panels 14A, gas cap covers 14C, or lift gate 14B (see FIG. 1), or other interior closures such as glove compartment doors, may be projected onto surface 19, with occupant 12 merely having to step on a particular projected symbol to thereby signal to controller 32 to open the corresponding closure, as described hereinabove.

In order to ensure that closure panel 14A opens only when desired, and does not automatically open simply because occupant 12 carries emitter 25 in proximity to vehicle 10, controller 32 is preferably adapted to default to a second predetermined vehicle response after passage of a designated interval or duration. After receiving no response within the designated duration, such as 5 to 10 seconds, or after receiving an incorrect or unrecognized response when compared to a stored expected occupant response, closure panel 14A is preferably unlocked and/or opened, or locked and/or closed, only using standard available methods, such as a key fob button or closure panel key. However, as the second predetermined vehicle response is determinable by occupant 12 and programmable into controller 32, the actual vehicle response may be any response desired by occupant 12, such as unlocking, locking, and/or complete or partial opening or closing of one or more closure panels 14A or other closures.

Alternately, audio receiver 41 (see FIGS. 2 and 3) as described hereinabove may capture or detect a spoken sound, word, or phrase of occupant 12 and relay the captured data to controller 32. Using audio receiver 41, a spoken sound, word, or phrase of occupant 12 may be used in place of or in addition to a gesture (arrow B of FIG. 4) to signal the occupant response. For example, occupant 12 may signal the desire to open or close closure panel 14A with a gesture, and by using a spoken word or phrase may signal unlocking a different closure panel, trunk, or other such closure.

Similarly, touch-sensitive sensor 43 (see FIGS. 1 and 3) may be used in place of or in addition to a gesture and/or audio receiver 41 to signal the desired vehicle response. In this instance, occupant 12 may signal a desire to open or close closure panel 14A with a bump or touch of an elbow against or near touch-sensitive sensor 43, but use a unique gesture and/or spoken word or phrase to signal for the unlocking/locking and/or opening/closing of a separate closure panel, trunk, or other such vehicle closure.

Figure 5:
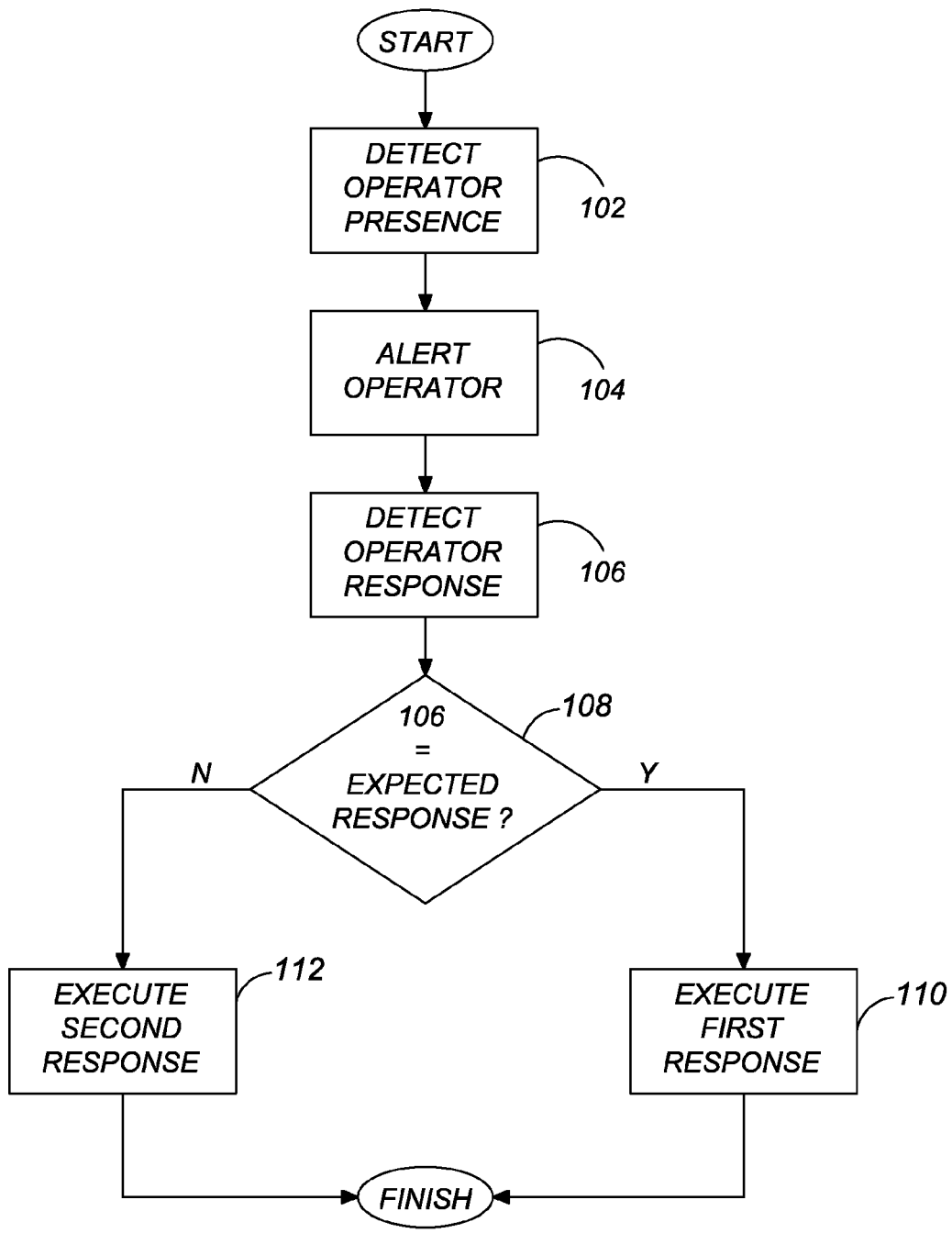
FIG. 5 is a flow chart describing a method of activating an automatically actuatable vehicle closure panel.

Turning to FIG. 5, algorithm 100 of the invention is shown, with algorithm 100 being programmed or otherwise stored in memory 34 of controller 32 (see FIG. 2). Algorithm 100 begins with step 102, with controller 32 detecting the proximate presence of occupant 12 (see FIG. 1), or more precisely, of emitter 25 on the person of occupant 12. As previously described hereinabove, detection step 102 is preferably accomplished using RF receiver 30 that is positioned in an appropriate location on or within vehicle 10. Once the presence of occupant 12 has been detected or otherwise verified, algorithm 100 proceeds to step 104.

At step 104, algorithm 100 alerts occupant 12 of successful detection (see step 102) and the activation of one of the various occupant response sensors 40 (see FIG. 3). Such activation may occur in conjunction with a visible and/or audible alarm or indicator (not shown), or in the instance of optical sensor 42, by way of customizable logo 21 (see FIG. 4). In this way, occupant 12 is made aware of both his or her detected presence and the activation of one or more occupant response sensors 40. Algorithm 100 then proceeds to step 106.

At step 106, algorithm 100 detects the occupant response. As described hereinabove, such a response may take the form of a gesture (arrow B of FIG. 4a), and/or a spoken word or phrase, and/or contact with a touch-sensitive sensor 43. Once an occupant response is detected, or after passage of a preset duration without a detected occupant response, algorithm 100 proceeds to step 108.

At step 108, algorithm 100 compares the detected occupant response (or passage of preset duration) to stored expected occupant response or responses in memory 34. In the event that the detected occupant response equals a predetermined occupant response, algorithm 100 proceeds to step 110. In the event the detected occupant response does not equal the predetermined occupant response, algorithm 100 proceeds to step 112. This may occur when, for example, motion of a foot 12A (see FIG. 4) across light beam 20 is detected in a right-to-left direction when the stored expected gesture is the motion of the same foot 12A in the opposite or left-to-right direction. Likewise, algorithm 100 proceeds to step 112 if a preset duration passes without detection of any occupant response at all.

At step 110, algorithm 100 executes a first predetermined vehicle response. Since at step 108 it was determined that the detected occupant response equals the stored expected occupant response, the "first predetermined vehicle response" of algorithm 100 preferably is the unlocking and/or opening of closure panel 14A automatically, thus allowing for "hands full" entry of vehicle 10 (see FIG. 1). Once inside vehicle 10, occupant 12 may then close closure panel 14A manually or automatically as desired.

At step 112, algorithm 100 executes a second predetermined vehicle response. Since at step 108 is was determined that the detected occupant response did not equal the stored expected occupant response, or that a preset interval of time has passed without any detected occupant response at all, the "second predetermined vehicle response" of algorithm 100 is preferably maintenance of the status quo of closure panel 14. For example, if closure panel 14A is determined to be locked at the initiation of occupant detection step 106, at step 112 closure panel 14A preferably will remain locked until occupant 12 unlocks and/or opens closure panel 14A manually or automatically.

An audio warning may also sound to provide notice that an incorrect or no response was determined. However, within the scope of the invention both the first and second predetermined vehicle responses may be programmed and modified as desired by occupant 12. In this manner, the invention may provide enhanced entry/egress to vehicle 10 without requiring occupant 12 to empty his or her hands, which may also prove beneficial for facilitating access to vehicle 10 by young children, the elderly, and/or disabled drivers or passengers.

While the best modes for carrying out the invention have been described in detail, those familiar with the art to which this invention relates will recognize various alternative designs and embodiments for practicing the invention within the scope of the appended claims.

The invention claimed is:

1. A vehicle comprising:
a closure panel;
an actuator configured to automatically move said closure panel in at least one direction;
a radio frequency (RF) receiver that detects an RF signal emitted by an RF emitter to thereby detect the presence of a potential occupant of the vehicle;
an optical sensor that detects a response of said occupant wherein the optical sensor selectively generates and projects a concentrated light beam onto a surface, and detects a predetermined gesture of the occupant made with respect to the light beam without using the RF receiver; and
a controller having a stored expected response of said occupant that is selectable by the occupant and recorded by the controller to provide a unique coded command, including an expected interruption of the concentrated light beam via the predetermined gesture of the occupant;
wherein said controller receives the detected response of the occupant from the optical sensor, compares said detected response of said occupant to said stored expected response of said occupant, and activates said actuator to thereby automatically move said closure panel in said at least one direction when both said presence is detected and said detected response of said occupant equals said stored expected response of said occupant.

2. The vehicle of claim 1, further comprising an additional sensor that detects the response of said occupant, wherein the additional sensor is selected from the group consisting essentially of an audio receiver, an ultrasonic sensor, a laser sensor, and a touch-sensitive sensor.

3. The vehicle of claim 2, wherein the vehicle rests on the surface, and wherein said optical sensor includes a light emitter configured to project said concentrated light beam onto said surface, and said expected response of said occupant is a predetermined movement or gesture of said occupant in the path of said light beam in a predetermined direction.

4. The vehicle of claim 3, wherein said light emitter is configured to generate a customizable logo and project said customizable logo onto said surface using said light beam.

5. The vehicle of claim 3, further comprising an ultrasonic sensor that determines time and directional information of said gesture.

6. The vehicle of claim 2, including voice recognition software, wherein said additional sensor includes said audio receiver, and wherein said expected response of said occupant is a predetermined word or phrase spoken by said occupant.

7. The vehicle of claim 2, including said touch-sensitive sensor, which detects one of: a change in a generated electromagnetic field around the touch-sensitive sensor and a change in capacitance around the touch-sensitive sensor.

8. The vehicle of claim 1, wherein said stored expected response of said occupant is programmable into said controller by said occupant.

9. An automatic closure panel opening apparatus for use with a vehicle having a closure panel and an actuator configured for automatically opening and closing the closure panel, the apparatus comprising:
a radio frequency (RF) receiver configured to receive an RF signal from an RF emitter that is positioned external to the vehicle to thereby detect the presence of a potential occupant of the vehicle;
an optical sensor configured to selectively generate and project a concentrated light beam from an underside of the vehicle onto a surface upon which the vehicle rests, and to detect a response of said occupant by detecting a gesture of said occupant at the underside of the vehicle with respect to said concentrated light beam; and
a controller having a stored expected occupant response, including an expected interruption of the concentrated light beam in a predetermined direction, that is selectable by the occupant and recorded by the controller to provide a unique coded command, wherein said controller compares said detected response of said occupant to said stored expected response of said occupant, and activates said actuator to move the closure panel when said presence is detected and when said detected response of said occupant equals said stored expected response of said occupant.

10. The apparatus of claim 9, further comprising an additional sensor that is selected from the group consisting essentially of an audio receiver, an ultrasonic sensor, a laser sensor, and a touch-sensitive device.

11. The apparatus of claim 10, including said ultrasonic sensor, wherein said ultrasonic sensor determines time and directional information of the gesture of said occupant in the path of said light beam.

12. The apparatus of claim 11, wherein said optical sensor includes a light emitter that is configured to generate a customizable logo and projects said customizable logo onto said surface as said light beam.

13. The apparatus of claim 10, including said audio receiver, wherein said expected response of said occupant includes a predetermined word or phrase spoken by said occupant.

14. A method for automatically opening a closure panel of a vehicle comprising:
recording, using a controller, an expected gesture of a potential occupant of the vehicle as a unique coded command;
detecting the presence of the potential occupant of the vehicle using a radio frequency (RF) receiver which receives RF signals from an RF emitter positioned external to the vehicle;
alerting said occupant that said presence has been detected;

generating a light beam, and projecting said light beam from an underside of the vehicle onto a surface on which the vehicle rests;

detecting a gesture of said occupant with respect to said light beam, and without respect to motion of the RF emitter, as a detected response of said occupant, including detecting a direction of said gesture with respect to said light beam;

comparing said detected response of said occupant to a stored expected response of said occupant; and automatically moving the vehicle closure panel in a predetermined direction via a controller of the vehicle when said detected response of said occupant equals said expected response of said occupant.

15. The method of claim 14, wherein the vehicle includes an ultrasonic sensor, wherein said detecting said direction of said gesture includes ultrasonically detecting time and directional information of said gesture.

16. The method of claim 14, wherein said detecting a response of said occupant further comprises detecting the breaking of a projected light beam using said gesture.

17. The method of claim 14, wherein said detecting a response of said occupant further comprises using speech recognition software to detect an expected word or phrase spoken by said occupant.

18. The method of claim 14, further comprising activating a warning device before opening said closure panel.

19. The method of claim 14, including a touch-sensitive sensor, wherein detecting the gesture includes detecting one of a change in a generated electromagnetic field with respect to the touch-sensitive sensor and a change in capacitance with respect to the touch-sensitive sensor.

* * * * *